(12) United States Patent
Xiao

(10) Patent No.: US 11,248,756 B2
(45) Date of Patent: Feb. 15, 2022

(54) BACKLIGHT MODULE AND DISPLAY APPARATUS

(71) Applicants: K-TRONICS (SUZHOU) TECHNOLOGY CO., LTD., Jiangsu (CN); BOE TECHNOLOGY GROUP CO., LTD., Beijing (CN)

(72) Inventor: Jun Xiao, Beijing (CN)

(73) Assignees: K-TRONICS (SUZHOU) TECHNOLOGY CO., LTD., Jiangsu (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/905,534

(22) Filed: Jun. 18, 2020

(65) Prior Publication Data
US 2021/0048156 A1 Feb. 18, 2021

(30) Foreign Application Priority Data
Aug. 16, 2019 (CN) .......................... 201910760617.6

(51) Int. Cl.
| | | |
|---|---|---|
| G02F 1/13357 | (2006.01) |
| F21S 4/00 | (2016.01) |
| F21V 3/00 | (2015.01) |
| F21V 7/00 | (2006.01) |
| F21V 19/00 | (2006.01) |
| H05K 7/14 | (2006.01) |

(52) U.S. Cl.
CPC .................. *F21S 4/00* (2013.01); *F21V 3/00* (2013.01); *F21V 7/005* (2013.01); *F21V 19/00* (2013.01); *G02F 1/133603* (2013.01); *H05K 7/1438* (2013.01)

(58) Field of Classification Search
CPC ................................................ G02F 1/133603
See application file for complete search history.

(56) References Cited

U.S. PATENT DOCUMENTS

| | | | |
|---|---|---|---|
| 2007/0211205 A1* | 9/2007 | Shibata | F21V 29/74 349/161 |
| 2008/0055517 A1 | 3/2008 | Yu | |
| 2013/0070165 A1* | 3/2013 | Shimizu | H04N 7/00 348/739 |

FOREIGN PATENT DOCUMENTS

| | | |
|---|---|---|
| CN | 101324325 A | 12/2008 |
| CN | 202140897 U | 2/2012 |
| CN | 102606963 A | 7/2012 |
| CN | 202868483 U | 4/2013 |
| CN | 108594521 A | 9/2018 |
| CN | 109945144 A | 6/2019 |

OTHER PUBLICATIONS

First Chinese Office Action dated Dec. 28, 2020, received for corresponding Chinese Application No. 201910760617.6, 18 pages.

* cited by examiner

*Primary Examiner* — Sean P Gramling
(74) *Attorney, Agent, or Firm* — Kinney & Lange, P.A.

(57) ABSTRACT

The present disclosure provides a backlight module and a display apparatus. In one embodiment, the backlight module includes: a frame body defining a cavity therein and having an opening communicated with the cavity; and a light strip disposed at the opening of the frame body and detachably connected to the frame body, wherein the light strip comprises a lamp bead that is disposed toward the cavity through the opening.

13 Claims, 2 Drawing Sheets

BACKLIGHT MODULE AND DISPLAY APPARATUS

CROSS-REFERENCE TO RELATED APPLICATION

This application claims priority of Chinese Patent Application No. 201910760617.6 filed on Aug. 16, 2019 in China National Intellectual Property Administration, the disclosure of which is incorporated herein by reference in entirety.

TECHNICAL FIELD

The present disclosure relates to the field of display technology, and in particular, to a backlight module and a display apparatus.

BACKGROUND

In the backlight module in the related art, the light strip is placed inside the cavity of the backlight module, and the light strip is the most easily damaged part in the backlight module, so the light strip will often need to be replaced or repaired.

At present, when the light strip needs to be replaced or repaired, the cavity of the module needs to be disassembled in the dust-free workshop before the light strip can be replaced or repaired. This method is more complicated and has lower efficiency.

Therefore, how to improve the efficiency of replacing or repairing the light strip has become an urgent problem to be solved.

SUMMARY

According to an aspect of the present disclosure, there is provided a backlight module, comprising:

a frame body, defining a cavity therein and having an opening communicated with the cavity; and a light strip, disposed at the opening of the frame body and detachably connected to the frame body, wherein the light strip comprises a lamp bead that is disposed toward the cavity through the opening.

In some embodiments, the backlight module further comprises: a fixation backboard disposed at the opening of the frame body and connected to the frame body; wherein the light strip is detachably connected to the fixation backboard, and the fixation backboard has a first through hole through which the lamp bead enters the cavity.

In some embodiments, the fixation backboard has a plurality of said first through holes, the light strip has a plurality of said lamp beads, and the plurality of lamp beads enter the cavity through the plurality of first through holes, respectively.

In some embodiments, the frame body comprises a bent portion extending towards the opening, and the bent portion is connected to the fixation backboard.

In some embodiments, the bent portion and a side surface of the frame body form an "L" shape when viewed in cross section.

In some embodiments, the light strip is disposed at the opening of the frame body and detachably connected to the frame body; the light strip has a plurality of said lamp beads, the frame body has a plurality of said openings, each of the openings corresponds to at least one of the lamp beads, and each of the lamp beads enters the cavity through a corresponding one of the openings.

In some embodiments, the light strip further comprises an endothermic lamp plate on which the lamp bead is disposed, the endothermic lamp plate abuts against the frame body and is detachably connected to the frame body.

In some other embodiments, the light strip further comprises an endothermic lamp plate on which the lamp bead is disposed, the endothermic lamp plate abuts against the fixation backboard and is detachably connected to the fixation backboard.

In some embodiments, the backlight module further comprises: a thermally conductive backboard detachably connected to the frame body, wherein the light strip is disposed between the thermally conductive backboard and the frame body.

In some other embodiments, the backlight module further comprises: a thermally conductive backboard detachably connected to the fixation backboard, wherein the light strip is disposed between the thermally conductive backboard and the fixation backboard.

In some embodiments, the backlight module further comprises: a thermal insulation board, disposed at a side of the fixation backboard away from the thermally conductive backboard, and connected to the fixation backboard; wherein the thermal insulation board comprises a plurality of second through holes, the light strip comprises a plurality of said lamp beads, and the plurality of lamp beads enter the cavity through the plurality of second through holes, respectively.

In some embodiments, the backlight module further comprises: a front frame part disposed on a side of the frame body opposing to the opening.

In some embodiments, the backlight module further comprises: an optical film fixedly disposed on a side of the front frame part close to the cavity; and a diffusion sheet fixedly disposed on a side of the optical film close to the cavity.

In some embodiments, the backlight module further comprises: an optical reflective sheet, wherein one edge of the optical reflective sheet is connected to a side of the thermal insulation board close to the cavity or a side of the fixation backboard close to the cavity, and the other edge is connected to an edge of the diffusion sheet, and an angle between the optical reflective sheet and the front frame part is less than 90°.

In some embodiments, the backlight module further comprises: the backlight module comprises a plurality of said light strips, and the optical reflective sheet is disposed at a same side of the plurality of light strips.

According to another aspect of the present disclosure, there is provided a display apparatus, comprising: the backlight module according to any one of the abovementioned embodiments; and a display screen disposed on a side of the frame body of the backlight module away from the light strip.

The above description is only an overview of the technical solutions of the present disclosure. In order to understand the technical means of the present disclosure more clearly, it can be implemented in accordance with the contents of the specification, and in order to make the above and other purposes, features and advantages of the present disclosure more obvious and understandable, specific embodiments of the present disclosure are specifically mentioned in the following.

DETAILED DESCRIPTION OF EMBODIMENTS

In order to further illustrate the technical means and effects adopted by the present disclosure to achieve the intended purpose of the invention, the specific implementations, structures, features and efficacy of the backlight module and the display apparatus proposed in accordance with the present disclosure with reference to the accompanying drawings and exemplary embodiments are described as detailed below.

The present disclosure is further described in detail below with reference to the drawings and embodiments.

Figure 1:
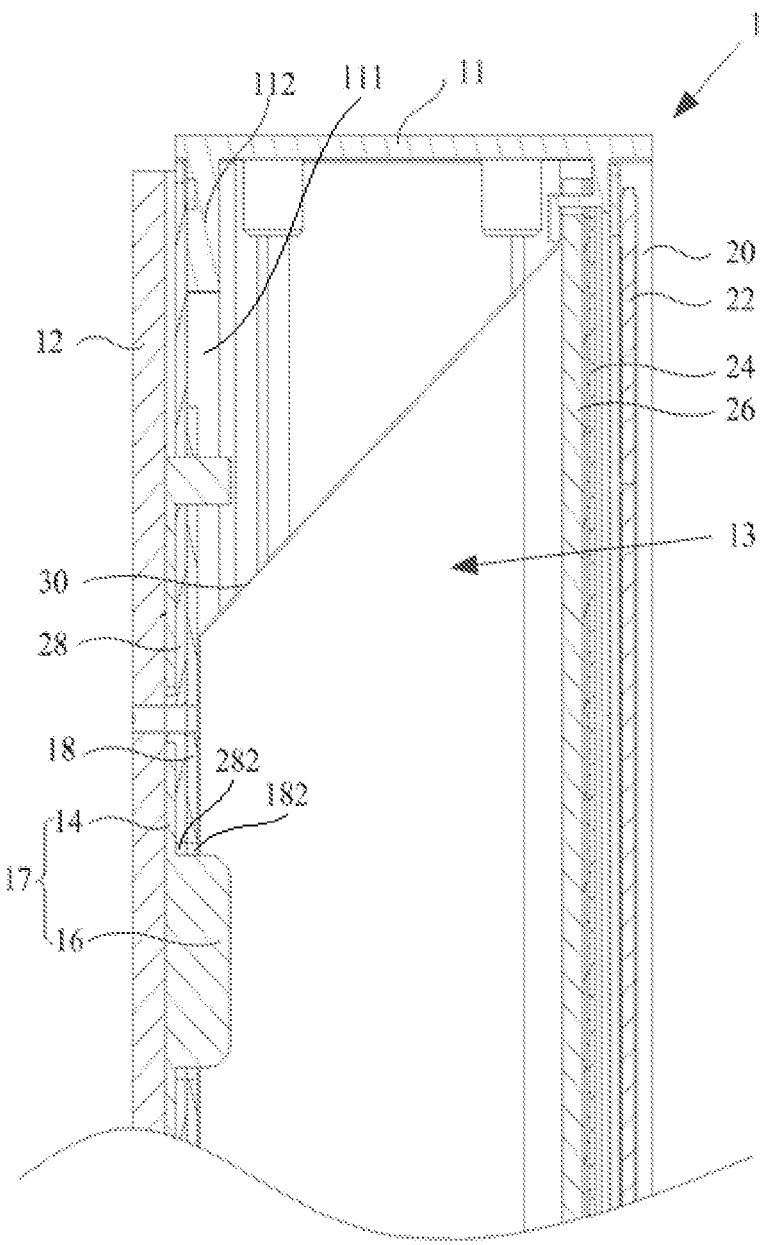
FIG. 1 is a schematic cross-sectional view of a backlight module according to an embodiment of the present disclosure.
Figure 2:
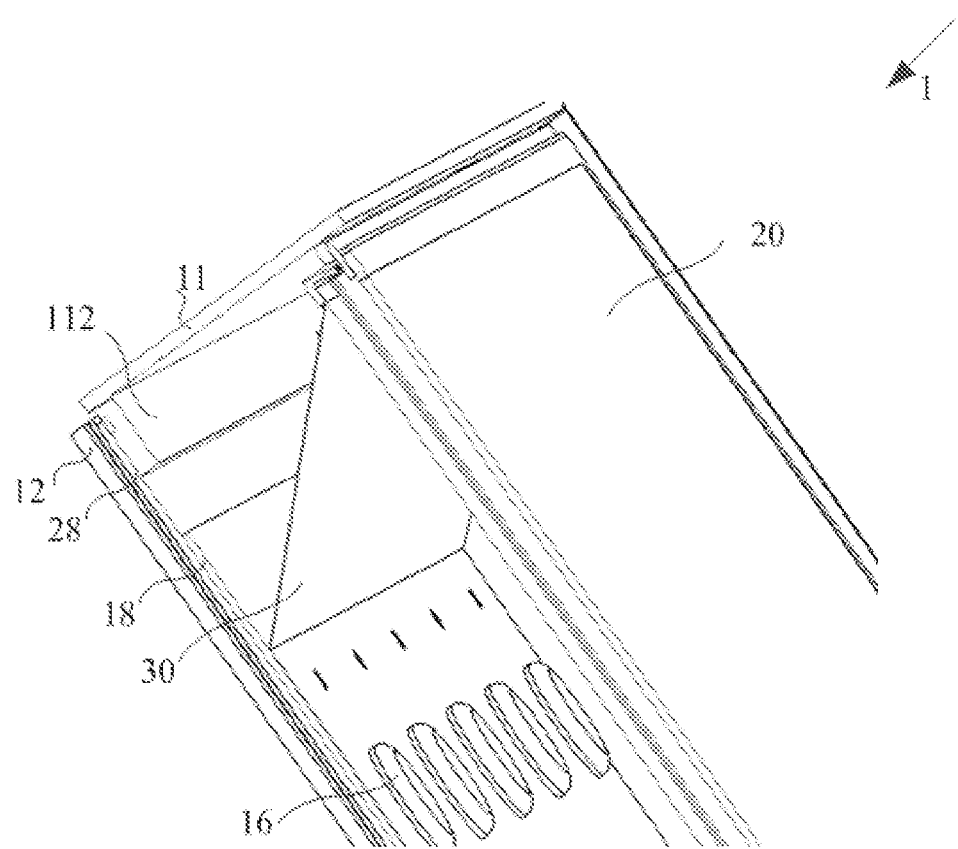
FIG. 2 is a schematic cross-sectional view showing a three-dimensional structure of a backlight module according to an embodiment of the present disclosure.

FIG. 1 is a schematic cross-sectional view of a backlight module according to an embodiment of the present disclosure; and FIG. 2 is a schematic cross-sectional view showing a three-dimensional structure of a backlight module according to an embodiment of the present disclosure. It should be noted that both FIG. 1 and FIG. 2 schematically show the partial structure of the backlight module. As shown in FIGS. 1 and 2, an embodiment of the present disclosure provides a backlight module 1 including a frame body 11 and a light strip 17. A cavity 13 is defined in the frame body 11, and the frame body 11 has an opening 111 communicated with the cavity 13. The light strip 17 is disposed at the opening 111 of the frame body 11 and is detachably connected to the frame body 11, and the light strip 17 includes a lamp bead 16, and the lamp bead 16 is disposed towards the cavity through the opening 111.

The backlight module 1 provided by the embodiment of the present disclosure includes a frame body 10, as part of the outer frame of the module, and a light strip 17. The frame body 10 encloses and defines the cavity 13, and the frame body 10 has an opening 111 communicated with the cavity 13. The light strip 17 is disposed at the opening 111 of the frame body 10 and is detachably connected to the frame body 11, and the lamp bead 16 of the light strip 17 is disposed toward the cavity 13 through the opening 111 so that the light emitted by the lamp bead 16 can diffuse to the cavity 13 to realize the role of the backlight module 1. The light strip 17 is disposed at the opening 111 of the frame body 11 and is detachably connected to the frame body 11, so that when the light strip 17 is replaced or repaired, only the light strip 17 is disassembled from the frame body 11 to complete the replacement or repair of the light strip 17, as a result, the light strip 17 can be replaced or repaired without disassembling the cavity 13 of the frame body 11, making the replacement or repair of the light strip 17 more simple and convenient, which improves the efficiency of replacing or repairing the light strip 17.

In the exemplary embodiment shown in FIG. 1 and FIG. 2, the backlight module provided by the embodiment of the present disclosure further includes: a fixation backboard 28. The fixation backboard 28 is disposed at the opening 111 of the frame body 11, and is connected to the frame body 11. The light strip 17 is detachably connected to the fixation backboard 28. The fixation backboard 28 has a first through hole 282. The lamp bead 16 enters the cavity 13 through the first through hole 282, and abuts against the hole wall of the first through hole 282. More specifically, although FIG. 1 only schematically shows one first through hole 282 and one lamp bead, the fixation backboard 28 may include a plurality of the first through holes 282, and the light strip 17 may include a plurality of the lamps beads 16, and the plurality of lamp beads 16 enter into the cavity 13 through the plurality of first through holes 282, respectively, and abut against hole walls of the corresponding first through holes 282, respectively.

In the exemplary embodiment shown in FIGS. 1 and 2, the fixation backboard 28 is provided at the opening 111 of the frame body 11, and is fixedly connected to the frame body 11, so that the fixation backboard 28 and the frame body 11, serving as an outer frame of the module, enclose and define the cavity 13 together. Each lamp bead 16 of the light strip 17 enters the corresponding first through hole 282 in the fixation backboard 28 and abuts against the hole wall of the first through hole 282, thereby realizing the stable mounting of the lamp bead 16 to the first through hole 282 of the fixing backboard 28. At the same time, the light strip 17 is detachably connected to the fixation backboard 28, so that when the light strip 17 is damaged, only the light strip 17 needs to be detached from the fixation backboard 28, and the exposed cavity 13 can be shielded by a shielding plate or other coverings after the light strip 17 is detached, so that the light strip 17 can be replaced outdoors, instead of being detached in a dust-free workshop, making it easier to replace or repair the light strip 17, and reducing the cost of repairing or replacing the light strip 17. In addition, there is no need to disassemble other parts, which can make the replacement or repair of the light strip 17 more simply and convenient, and improve the efficiency of replacing or repairing the light strip 17.

In some embodiments, the fixing backboard 28 and the frame body 11 are connected by bolts, or the fixing backboard 28 and the frame body 11 are connected by welding.

In some embodiments, the fixation backboard is an iron backboard, and the strength of the iron backboard is high, and damage is unlikely to occur.

According to an embodiment of the present disclosure, as shown in FIGS. 1 and 2, the frame body 11 includes: a bent portion 112 extending toward the opening 111, wherein the bent portion 112 is connected to the fixation backboard 28, in order to achieve a fixed connection between the frame body and the fixation backboard 28. More specifically, the bent portion 112 and the side surface of the frame body 11 form an "L" shape when viewed in cross section.

In an exemplary embodiment, two opposite side surfaces of the frame body 11 are provided with bent portions 112 extending toward the opening 111. From the cross-sectional view shown in FIG. 1, the frame body 11 is composed of two "L"-shaped frame body parts, the opening 111 is located between the bent portions 112 of the two "L"-shaped frame body parts arranged opposite to each other, and the bent portion 112 of the "L"-shaped frame body part is located at the bottom of the outer frame of the module, the fixation backboard 28 is fixedly connected to the bent portion 112, and the fixation backboard 28 is parallel to the bent portion 112, and part of the fixation backboard 28 and the bent portion 112 can be stacked and then connected, After being stacked on each other, the connection relationship is more stable, so that the connection between the fixation backboard 28 and the bent portion 112 is more stable, realizing the fixed connection between the fixation backboard 28 and the frame body 11. More specifically, the fixation backboard 28 is connected to the side of the bent portion 112 away from the cavity 13, so that the connection between the fixation backboard 28 and the frame body 11 is not exposed, which is more aesthetic.

In some alternative embodiments of the present disclosure, the light strip includes a plurality of lamp beads, the frame body includes a plurality of openings, each of the openings corresponds to at least one of the lamp beads, and each of the lamp beads extends into the cavity through the corresponding opening and abuts against the side wall of the corresponding opening.

In this alternative embodiment, there are multiple openings of the frame body, the shape of each opening is adapted to the shape of one lamp bead, each lamp bead enters one opening, and the lamp bead abuts against the side wall of the opening, so the lamp bead can be fixed to the opening. The light strip can be detachably connected to the frame body, so that when the light strip is damaged, it only requires to remove the light strip from the frame body, and use a shielding plate or other coverings to shield the cavity exposed after the light strip is removed, so that the light strip can be replaced outdoors, instead of removing the light strip in a dust-free workshop. In addition, no other parts are required to be disassembled, thus it can make the replacement or repair of the light strip more convenient and easy, and improve the efficiency of replacing or repairing the light strip. That is, in the alternative embodiment, the light strip can be directly and detachably mounted to the opening of the frame body without using the fixation backboard.

According to an embodiment of the present disclosure, the light strip further includes an endothermic lamp plate, and the lamp bead is disposed on the endothermic lamp plate. The endothermic lamp plate abuts against the frame body and is detachably connected to the frame body, or the endothermic lamp plate abuts against the fixation backboard and is detachably connected to the fixation backboard. According to an embodiment of the present disclosure, the backlight module further includes a thermally conductive backboard, the thermally conductive backboard is detachably connected to the frame body, and the light strip is disposed between the thermally conductive backboard and the frame body. Alternatively, the thermally conductive backboard is detachably connected to the fixation backboard, and the light strip is disposed between the thermally conductive backboard and the fixation backboard. According to an embodiment of the present disclosure, the backlight module further includes a thermal insulation board disposed on a side of the fixation backboard away from the thermally conductive backboard and connected to the fixation backboard. The thermal insulation board includes a plurality of second through holes, the light strip includes a plurality of lamp beads, and the plurality of lamp beads enter the cavity through corresponding second through holes, respectively, and abut against hole walls of the second through holes, respectively.

As shown in FIG. 1, in an exemplary embodiment of the present disclosure, the light strip 17 further includes an endothermic lamp plate 14, the lamp bead 16 is disposed on the endothermic lamp plate 14, and the endothermic lamp plate 14 abuts against the fixation backboard 28 and is detachably connected to the fixation backboard 28. In an alternative embodiment where the fixation backboard is omitted, the lamp bead is disposed on the endothermic lamp plate, and the endothermic lamp plate directly abuts against the frame body 11 and is detachably connected to the frame body.

According to an embodiment of the present disclosure, the light strip 17 includes an endothermic lamp plate 14 and a lamp bead 16 disposed on the endothermic lamp plate 14. The orthographic projection area of the endothermic lamp plate 14 on the frame body 11 is greater than the orthographic projection area of the lamp bead 16 on the frame body 11. As shown in FIG. 1, the side of the endothermic lamp plate 14 with the lamp bead 16 (i.e., the side close to the cavity 13) faces the cavity 13. The side of the endothermic lamp plate 14 with the lamp bead 16 abuts against the fixation backboard 28 or the frame body 11, and is detachably connected to the fixation backboard 28 or the frame body 11, thereby realizing the detachable connection between the light strip 17 and the fixation backboard 28 or the frame body 11. As shown in FIG. 1, in the exemplary embodiment where the fixation backboard 28 is disposed at the opening, the side of the endothermic lamp plate 14 with the lamp bead 16 abuts against the fixation backboard 28 and is detachably connected to the fixation backboard 28. In the alternative embodiment where the fixation backboard 28 is omitted, in case that the frame body 11 is provided with a plurality of openings corresponding to the plurality of lamp beads 16, the side of the endothermic lamp plate 14 with the lamp beads 16 abuts against the frame body 11, and can be detachably connected to the frame body 11, so that the endothermic lamp plate 14 can absorb most of the heat emitted by the lamp beads 16 when working, and then the endothermic lamp plate 14 conducts the heat to the outside to complete the heat dissipation, only a small amount of heat is dissipated into the cavity 13. Therefore, in the backlight module 1 provided by the present disclosure, when the lamp bead 16 works, most of the heat will be dissipated to the outside through the endothermic lamp plate 14, and only a small amount of the heat is transferred to the cavity 13, so that the temperature of the cavity 13 can be well controlled, thereby extending the service life of the module.

In some embodiments, the material of the endothermic lamp plate 14 is an aluminum material. The aluminum material has good ductility, it is beneficial to processing and molding, to realize the manufacture of the endothermic lamp plate 14. Also, the aluminum material has good thermal conductivity and can quickly absorb the heat emitted by lamp bead 16, so that the heat of the lamp bead 16 can be prevented from being radiated to the cavity 13.

In some embodiments, as shown in FIG. 2, each light strip 17 includes one endothermic lamp plate 14 and a plurality of lamp beads 16, and the plurality of lamp beads 16 are evenly spaced on the endothermic lamp plate 14. One endothermic lamp plate 14 is provided with multiple lamp beads 16, which is beneficial to provide more light sources for the entire backlight module 1. By provision of multiple lamp beads 16 on one endothermic lamp plate 14, one endothermic lamp plate 14 can be used to absorb heat for multiple lamp beads 16, thereby preventing the heat dissipated from the multiple lamp beads 16 from dissipating into the cavity 13 when working. Moreover, a plurality of light strips 17 are evenly spaced along the thermally conductive backboard 12, so that more lamp beads 16 can be provided on the side of the thermally conductive backboard 12 close to the cavity 13, so as to provide more light sources for the entire backlight module 1, ensuring the brightness of the backlight module 1, and the lamp plates for multiple light strips 17 are fixed and attached to the side of the thermally conductive backboard 12 close to the cavity 13, so that the thermally conductive backboard 12 can absorb the heat and dissipate the heat from the light plates to the outside, thus controlling the temperature of the cavity 13.

In some embodiments, multiple light strips 17 are spaced along the length direction of the thermally conductive backboard 12; and each light strip 17 includes one endothermic lamp plate 14 and a plurality of lamp beads 16 spaced apart along the width direction of the thermally conductive backboard 12.

In some embodiments, the lamp beads 16 are detachably connected to the endothermic lamp plate 14. The detachable connection includes but is not limited to a threaded connection, so as to facilitate replacement of the lamp beads 16 only when the lamp beads 16 are damaged. The lamp beads 16 and the endothermic lamp plate 14 can also be connected by other connection methods.

In some embodiments, the lamp bead 16 is fixedly connected to the endothermic lamp plate 14.

As shown in FIGS. 1 and 2, in an exemplary embodiment of the present disclosure, the thermally conductive backboard 12 is detachably connected to the fixing backboard 28, and the light strip 17 is disposed between the thermally conductive backboard 12 and the frame body 11. In an alternative embodiment where the fixation backboard is omitted, the thermally conductive backboard 12 is detachably connected to the frame body 11, and the light strip 17 is disposed between the thermally conductive backboard 28 and the frame body 11.

In the embodiment of the present disclosure, the backlight module 1 further includes a thermally conductive backboard 12, and the thermally conductive backboard 12 is detachably connected to the fixation backboard 28 or the frame body 11, so as to prevent dust or other substances from entering the cavity 13, and the side of the endothermic lamp plate 14 away from the cavity 13 abuts against the thermally conductive backboard 12 so that the thermally conductive backboard 12 can protect the light strip 17. As shown in FIG. 1, in an exemplary embodiment where a fixation backboard 28 is provided at the opening, the thermally conductive backboard 12 is detachably connected to the fixation backboard 28. In an alternative embodiment where the fixation backboard 28 is omitted, when the frame body 11 is provided with a plurality of openings corresponding to the multiple lamp beads 16, the thermally conductive backboard 12 is detachably connected to the frame body 11, so that when the light strip 17 needs to be replaced, the light strip 17 can be disassembled by simply removing the thermally conductive backboard 12. Moreover, the side of the endothermic lamp plate 14 away from the cavity 13 abuts against the thermally conductive backboard 12, which can further absorb the heat in endothermic lamp plate 14 to prevent the heat in endothermic lamp plate 14 from spreading into the cavity 13, and then the thermally conductive backboard 12 conducts heat to the outside, to complete heat dissipation. As a result, the temperature of the cavity 13 can be well controlled, thereby extending the service life of the module.

In some embodiments, the thermally conductive backboard 12 is detachably connected to the fixation backboard 28, and the manner of detachable connection includes bolt connection and the like.

In some embodiments, the thermally conductive backboard 12 is an aluminum backboard. Using an aluminum backboard as the thermally conductive backboard 12 can better complete the heat absorption and heat release. In addition, aluminum has better ductility, is easy to manufacture, and has a lower cost.

In the embodiment of the present disclosure, as shown in FIGS. 1 and 2, the thermal insulation board 18 is disposed on a side of the fixation backboard 28 away from the thermally conductive backboard 12, and is connected to the fixation backboard 28. The thermal insulation board 18 includes a plurality of second through holes 182, and the light strip 17 includes a plurality of lamp beads 16, each of which enters the cavity 13 through a corresponding second through hole 182, and abuts against the hole wall of the second through hole 182.

As shown in FIG. 2, in an exemplary embodiment, the thermal insulation board 18 is disposed on a side of the fixation backboard 28 away from the thermally conductive backboard 12 and is connected to the fixation backboard 28, so that heat can be prevented from returning through the fixation backboard 28 into the cavity 13, further preventing the temperature of the cavity 13 from rising, thereby further ensuring the service life of the backlight module 1.

In some embodiments, an area of the side of the endothermic lamp plate 14 close to the lamp bead 16 is larger than the area of the side of the lamp bead 16 close to the endothermic lamp plate 14, so that the lamp bead 16 can be better fixed on the endothermic lamp plate 14, but meanwhile, the heat absorbed by the endothermic lamp plate 14 is likely to be conducted to the cavity 13 from the part of the endothermic lamp plate 14 where no lamp bead 16 is provided, and the temperature of the cavity 13 is increased. In response to this problem, the backlight module 1 provided by the present disclosure further includes a thermal insulation board 18. The thermal insulation board 18 is disposed on the side of the fixation backboard 28 close to the cavity 13, and the thermal insulation board 18 is parallel to the fixation backboard 28. The thermal insulation board 18 includes a second through hole 182, and the lamp bead 16 enters the first through hole 282 and the second through hole 182 in turn, and the side wall of the lamp bead 16 abuts against the first through hole 282 of the fixation backboard 28 and the second through hole 182 of the thermal insulation board 18 in sequence. The thermal insulation board 18 is extended in any direction away from the second through hole 182, the length of the thermal insulation board 18 extending in any direction is greater than the length of the endothermic lamp plate 14 extending in any direction at the outer peripheral connection point, so that the thermal insulation board 18 completely covers the part of the endothermic lamp plate 14 that is not connected to the lamp bead 16. The thermal insulation board 18 completely shields the parts of the endothermic lamp plate 14 that are not connected to the lamp bead 16 so that when the heat in the parts of the endothermic lamp plate 14 that are not connected to the lamp bead 16 is conducted to the cavity 13, the thermal insulation board 18 can prevent the heat from being conducted to the cavity 13. As a result, the heat in the endothermic lamp plate 14 can only be conducted to the outside through the endothermic lamp plate 14 and the thermally conductive backboard 12, further preventing the temperature of the cavity 13 from rising, thereby further ensuring service life of the backlight module 1.

In some embodiments, the thermal insulation board 18 is made from thermal insulation foam. The thermal insulation foam has a series of characteristics such as elasticity, light weight, fast pressure-sensitive fixing, convenience to use, flexible bending, ultra-thin volume, reliable performance, etc., it can be bonded to the fixation backboard 28 in a better manner. As a result, when the heat in the endothermic lamp plate 14 is conducted to the cavity 13, the thermal insulation foam can prevent the heat from being conducted to the cavity 13, so that the heat in the endothermic lamp plate 14 can only be conducted to the outside through the thermally conductive backboard 12, further preventing the temperature of the cavity 13 from rising, thereby further ensuring to extend the service life of the module.

In some embodiments, the connection between the thermal insulation board 18 and the fixation backboard 28 includes but is not limited to gluing or screw connection.

As shown in FIGS. 1 and 2, in the embodiment of the present disclosure, the backlight module further includes a front frame part 20, and the front frame part 20 is disposed on a side of the frame body opposing to the opening 111. The backlight module 1 further includes: an optical film 24 fixedly disposed on a side of the front frame part 20 close to the cavity 13; and a diffusion sheet 26 fixedly disposed on a side of the optical film 24 close to the cavity 13.

In this embodiment, the outer frame of the module includes the front frame part 20 and the frame body 11 composed of two oppositely arranged frame body parts. The frame body 11 and the front frame part 20 commonly define the cavity 13, or the frame body 11, the fixation backboard 28 and the front frame part 20 commonly define the cavity 13. Two ends of the front frame part 20 are respectively fixedly connected to the two frame body parts of the frame body 11 through a middle frame. The backlight module 1 further includes the optical film 24 and the diffusion sheet 26. The diffusion sheet 26 and the optical film 24 are sequentially stacked and fixedly connected. The diffusion sheet 26 diffuses the light emitted by the lamp bead 16, making the light coverage area larger. The optical film 24 breaks up the diffused light, making the light distribution even.

As shown in FIGS. 1 and 2, in the embodiment of the present disclosure, the backlight module 1 further includes: an optical reflective sheet 30. One edge of the optical reflective sheet 30 is connected to a side of the thermal insulation board 18 close to the cavity 13 or to a side of the fixation backboard 28 close to the cavity 13, the other edge of the optical reflective sheet 30 is connected to the end of the diffusion sheet 26, and an angle between the optical reflective sheet 30 and the front frame part 20 is less than 90°. More specifically, the backlight module 1 includes multiple light strips 17, and the optical reflective sheet 30 is located on the same side of the multiple light strips 17.

In this embodiment, one edge of the optical reflective sheet 30 is connected to the side of the thermal insulation board 18 close to the cavity 13, or one edge of the optical reflective sheet 30 is connected to the side of the fixation backboard 28 close to the cavity 13, and the other edge is connected to an end of the diffusion sheet 26, so that the optical reflective sheet 30 passes through the cavity 13. The angle between the optical reflective sheet 30 and the front frame part 20 is less than 90°, so that the optical reflective sheet 30 can reflect the light of the lamp bead 16 to the diffusion sheet 26, to achieve the diffusion of the light emitted by the lamp bead 16 on the diffusion sheet 26. In addition, the optical reflective sheet 30 is located on the same side of the multiple light strips 17, so that the optical reflective sheet 30 can reflect the light emitted by the multiple light strips 17. The reflection causes the light emitted by the multiple light strips 17 to be reflected to the diffusion sheet 26 through the optical reflective sheet 30.

In another aspect, an embodiment of the present disclosure provides a display apparatus. The display apparatus includes the backlight module 1 as described above; and a display screen 22. The display screen 22 is disposed on a side of the frame body 11 of the backlight module 1 away from the light strip 17. More specifically, in the embodiment shown in FIG. 1, the display screen 22 is disposed on the side of the optical film 24 of the backlight module 1 away from the light strip 17. The display apparatus includes all the technical features of the backlight module 1 as described above, and therefore includes all the beneficial technical effects of the backlight module 1, which will not be repeated here.

In this embodiment, the display screen 22 receives the light diffused through the diffusion sheet 26 and the light scattered by the optical film 24, so that the light emitted by the lamp bead 16 can hit the display screen 22 uniformly to achieve displaying of the display screen 22.

Embodiments of the present disclosure provide a backlight module and a display apparatus. The backlight module includes a frame body, a light strip, and a thermally conductive backboard. The frame body encloses to form a cavity, the frame body has an opening, and a light strip or a fixation backboard is provided at the opening. The light strip is detachably connected to the frame body or the fixation backboard, so that when the light strip is replaced or repaired, only the thermally conductive backboard needs to be disassembled, and then the light strip is disassembled from the frame body or the fixation backboard, to complete the replacement or repair of the light strip. As a result, the light strip can be replaced or repaired without disassembling the cavity of the frame body, making the replacement or repair of the light strip more simple and convenient, which improves the efficiency of replacing or repairing the light strip. Moreover, the light strip includes the lamp bead and the endothermic lamp plate. The endothermic lamp plate abuts against the thermally conductive backboard, and the lamp bead enters the cavity, so that most of the heat dissipated by the lamp bead when working will be absorbed by the endothermic lamp plate, and only a small amount of heat will be dissipated into the cavity. The heat absorbed by the endothermic lamp plate will be absorbed by the thermally conductive backboard, and will be dissipated to the outside through the thermally conductive backboard, thereby well controlling the temperature of the cavity, improving the quality of the product and prolonging the service life of the module.

The above are only specific implementations of the present disclosure, but the scope of protection of the present disclosure is not limited thereto. Any person skilled in the art can easily think of changes or replacements within the technical scope disclosed in the present disclosure, and they should be covered within the protection scope of the present disclosure. Therefore, the protection scope of the present disclosure shall be subject to the protection scope of the claims.

What is claimed is:

1. A backlight module, comprising:
   a frame body, defining a cavity therein and having an opening communicated with the cavity;
   a light strip, disposed at the opening of the frame body and detachably connected to the frame body, wherein the light strip comprises a lamp bead that is disposed toward the cavity through the opening;
   a fixation backboard disposed at the opening of the frame body and connected to the frame body, wherein the light strip is detachably connected to the fixation backboard, and the fixation backboard is provided with a first surface and a second surface that are opposite to each other;
   a thermally conductive backboard detachably connected to the first surface of the fixation backboard, wherein the light strip is disposed between the thermally conductive backboard and the fixation backboard; and
   a thermal insulation board, disposed at a side of the fixation backboard away from the thermally conductive backboard, and disposed on and connected to the second surface of the fixation backboard;
   wherein the light strip has a plurality of said lamp beads, the frame body has a plurality of said openings, each of the openings corresponds to at least one of the lamp beads, and each of the lamp beads enters the cavity through a corresponding one of the openings.

2. The backlight module of claim 1,
wherein the fixation backboard has a first through hole through which the lamp bead enters the cavity.

3. The backlight module of claim 1,
wherein the fixation backboard has a plurality of first through holes, the light strip has a plurality of said lamp beads, and the plurality of lamp beads enter the cavity through the plurality of first through holes, respectively.

4. The backlight module of claim 2, wherein:
the frame body comprises a bent portion extending towards the opening, and the bent portion is connected to the fixation backboard.

5. The backlight module of claim 4, wherein:
the bent portion and a side surface of the frame body form an "L" shape when viewed in cross section.

6. The backlight module of claim 1, wherein:
the light strip further comprises an endothermic lamp plate on which the lamp bead is disposed, the endothermic lamp plate abuts against the frame body and is detachably connected to the frame body.

7. The backlight module of claim 2, wherein:
the light strip further comprises an endothermic lamp plate on which the lamp bead is disposed, the endothermic lamp plate abuts against the fixation backboard and is detachably connected to the fixation backboard.

8. The backlight module of claim 1,
wherein the thermal insulation board comprises a plurality of second through holes, the light strip comprises a plurality of said lamp beads, and the plurality of lamp beads enter the cavity through the plurality of second through holes, respectively.

9. The backlight module of claim 8, further comprising a front frame part disposed on a side of the frame body opposing to the opening.

10. The backlight module of claim 9, further comprising:
an optical film fixedly disposed on a side of the front frame part close to the cavity; and
a diffusion sheet fixedly disposed on a side of the optical film close to the cavity.

11. The backlight module of claim 10, further comprising:
an optical reflective sheet,
wherein one edge of the optical reflective sheet is connected to a side of the thermal insulation board close to the cavity or a side of the fixation backboard close to the cavity, and the other edge is connected to an edge of the diffusion sheet, and an angle between the optical reflective sheet and the front frame part is less than 90°.

12. The backlight module of claim 11, wherein:
the backlight module comprises a plurality of said light strips, and the optical reflective sheet is disposed at a same side of the plurality of light strips.

13. A display apparatus, comprising:
the backlight module of claim 1; and
a display screen disposed on a side of the frame body of the backlight module away from the light strip.

* * * * *